US007505277B2

(12) United States Patent
Tracy et al.

(10) Patent No.: US 7,505,277 B2
(45) Date of Patent: Mar. 17, 2009

(54) SYSTEM COMPRISING A SLOT CONFIGURABLE TO RECEIVE A DEVICE HAVING AN INTERFACE TYPE THAT DIFFERS FROM THE INTERFACE TYPE OF THE SLOT

(75) Inventors: Mark S. Tracy, Tomball, TX (US); Jeffrey A. Lev, Cypress, TX (US); Walter J. Rankins, Spring, TX (US); Walter Fry, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 12 days.

(21) Appl. No.: 11/669,434

(22) Filed: Jan. 31, 2007

(65) Prior Publication Data

US 2008/0182458 A1 Jul. 31, 2008

(51) Int. Cl.
*H05K 1/14* (2006.01)

(52) U.S. Cl. ...................... 361/741; 361/737; 361/727; 234/451; 439/638; 439/945

(58) Field of Classification Search .................... 714/5; 345/157, 1.1; 361/741, 737, 727; 234/451; 439/638, 945
See application file for complete search history.

(56) References Cited

U.S. PATENT DOCUMENTS

| | | | | |
|---|---|---|---|---|
| 5,724,529 | A | 3/1998 | Smith et al. | |
| 5,748,443 | A * | 5/1998 | Flint et al. | 361/686 |
| 5,799,036 | A | 8/1998 | Staples | |
| 6,217,351 | B1 * | 4/2001 | Fung et al. | 439/131 |
| 6,272,017 | B1 | 8/2001 | Klatt | |
| 6,976,624 | B2 * | 12/2005 | Hsiao | 235/451 |
| 6,984,152 | B2 * | 1/2006 | Mowery et al. | 439/638 |
| 7,014,484 | B2 * | 3/2006 | Hagiwara | 439/159 |
| 2005/0273648 | A1 * | 12/2005 | Mambakkam et al. | 714/5 |
| 2006/0082518 | A1 * | 4/2006 | Ram | 345/1.1 |

* cited by examiner

*Primary Examiner*—Dean A. Reichard
*Assistant Examiner*—Andargie M Aychillhum

(57) ABSTRACT

A system comprises a chassis and a slot that is externally accessible on the chassis. The slot is configured to receive a first electronic device having a first electrical interface type. The slot is also configured to receive an adapter comprising a second electrical device having a second electrical interface type that is different than the first electrical interface type.

16 Claims, 2 Drawing Sheets

SYSTEM COMPRISING A SLOT CONFIGURABLE TO RECEIVE A DEVICE HAVING AN INTERFACE TYPE THAT DIFFERS FROM THE INTERFACE TYPE OF THE SLOT

BACKGROUND

Many computer systems, such as notebook computers, have multiple, externally accessible connectors and/or slots into which peripheral devices can be connected. Each such slot is configured for a specific type of device (e.g., PCMCIA, USB, etc.). While such an arrangement of connection types provides options to a user, some users might prefer a different set of connection choices. For example, while a notebook computer might provide one slot for a Secure Digital (SD) card, a user might prefer to have more than one SD card slot. The manufacturer/system designer has to decide which set of connection/slots to include based on a perception of what a majority of potential customers would want. While having multiple types of slots and connectors for peripheral devices provides choices to a user, the various slots and connectors are fixed at the factory thereby limiting flexibility of the system to be connected to peripherals other than what the computer's slots/connectors permit.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

Figure 1:
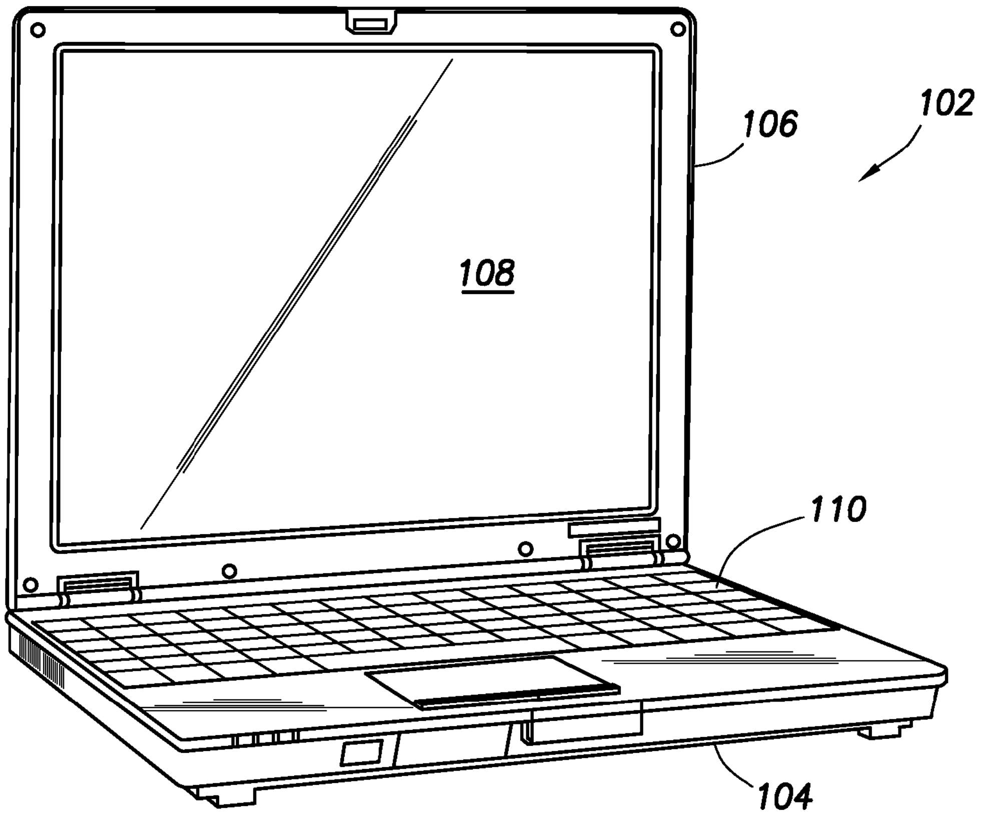
FIG. 1 shows a system in accordance with various embodiments.

FIG. 1 illustrates a computer 102 which, in the example of FIG. 1, comprises a notebook computer. The subject matter described herein, however, is usable in conjunction with other types of computer and other types of systems besides computers. The illustrative computer 102 comprises a chassis 104 with a hinged cover 106 having a flat-panel display 108. The cover 106 closes against chassis 104 to protect display 108 and keyboard 110, which is contained in chassis 104.

Figure 2:
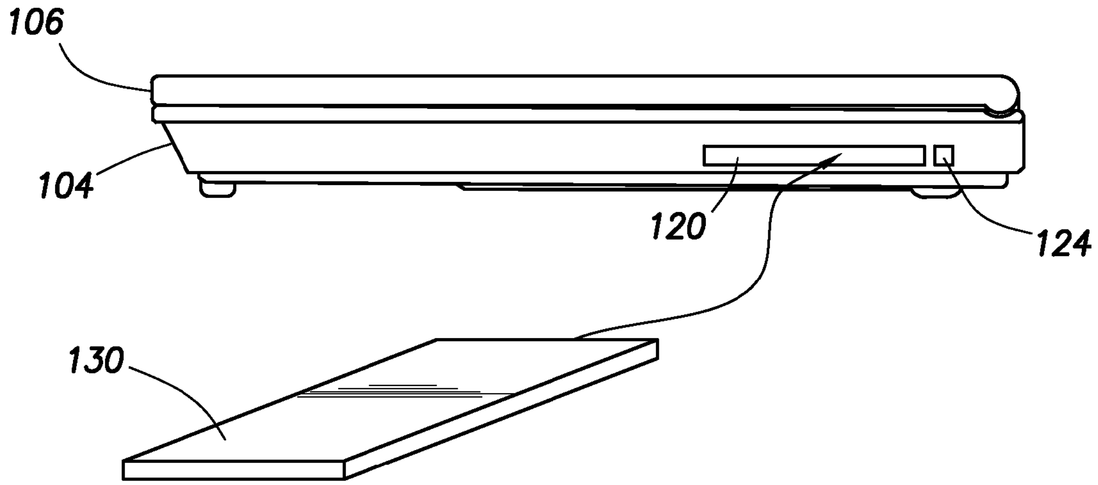
FIG. 2 shows a side view of the system of FIG. 1 in accordance with various embodiments.

FIG. 2 illustrates a side view of computer 102 with the hinged cover 106 (and thus display 108) in the closed position. As shown, a slot 120 is provided on a side surface of chassis 104. The slot 120 is configured for a predetermined type of electrical interface. Examples of the slot's electrical interface type comprise the Personal Computer Memory Card International Association (PCMCIA) and Universal Serial Bus (USB), but other electrical interface types are possible as well. A peripheral device can be installed in slot 120 as long as the peripheral device has an electrical interface that is compatible (e.g., the same as) the electrical interface of the computer's slot 120. FIG. 2 also illustrates a compatible peripheral device 130 that can be installed in slot 120. If the slot 120 is, for example, a PCMCIA slot, device 130 is a PCMCIA card (e.g., a wireless card). Absent the adapter described below, peripheral devices having a different electrical interface type (i.e., different than the electrical interface type of the slot) will not properly communicate and thus not be usable by the computer 102. An eject button 124 is also provided adjacent the slot 120 to eject whatever peripheral device is installed in the slot 120.

Figure 3:
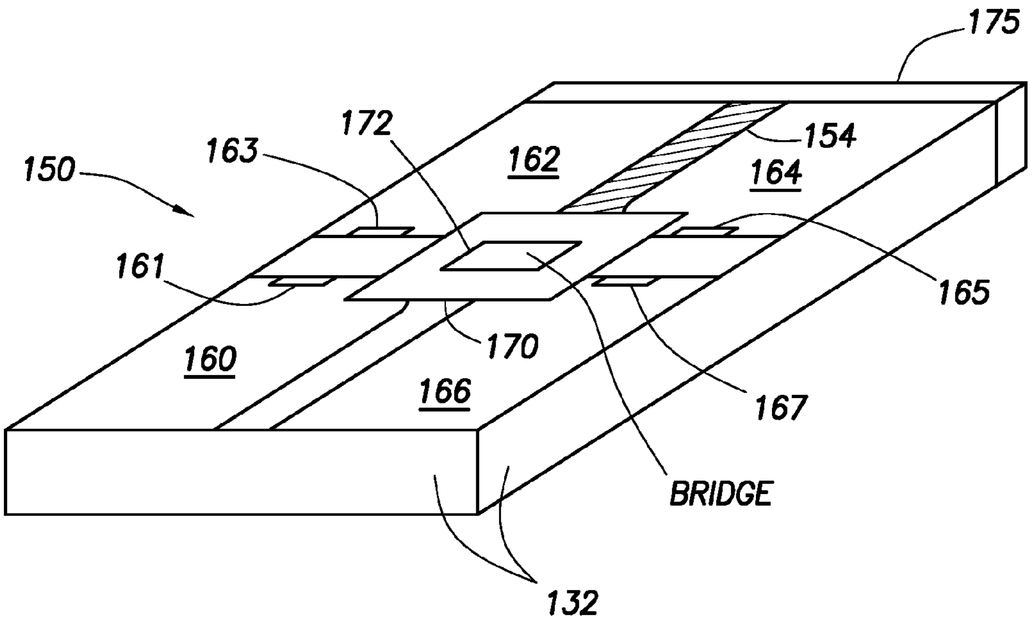
FIG. 3 illustrates an adapter in accordance with various embodiments and usable in conjunction with the system of FIG. 1.

FIG. 3 illustrates an embodiment of an adapter 150 that can be installed in slot 120 in place of peripheral device 130. The adapter 150 is adapted to receive one or more electronic devices that each have an electrical interface that differs from the electrical interface of the slot 120. Thus, the slot 120 is configured to receive either the adapter 150 having electronic devices that are incompatible with the electrical interface of the slot 120 or a peripheral device 130 that is compatible with the electrical interface of the slot 120. The adapter 150 containing otherwise incompatible electronic devices and the compatible peripheral devices can both be received into the slot, albeit not simultaneously, and communicatively coupled to the computer 102.

The embodiment of FIG. 3 illustrates that the adapter 150 comprises a generally rectangular outer frame 152 that is of a size and shape generally compatible with the size and shape of the slot 120. As such, the adapter 150 fits in slot 120 as would peripheral device 130. Further, the adapter 150 slides into and blind-mates into the slot 120 in much the same way as a peripheral device 130. In at least some embodiments, the adapter 150 is a tray on which electronic devices are mountable, the tray slidingly engaging into the slot 120.

The adapter 150 of FIG. 3 also comprises cross members 154 that define four receiving cavities 160, 162, 164, and 166. Each receiving cavity is adapted to receive an electronic device that has an electrical interface different from the electrical interface of the slot 120 into which the adapter is received. With four receiving cavities 160, 162, 164, and 166, four electronic devices are possible. Although four receiving cavities 160, 162, 164, and 166 are shown in the illustrative embodiment of FIG. 3, any other number of receiving cavities (i.e., one or more) can be provided. The number of receiving cavities is influenced by the size of the electronic devices that are to be received into the adapter and the anticipated number of electronic devices that a user would desire to use with the adapter.

In some embodiments, the electronic devices are pre-installed on the adapter 150 at the factory. In other embodiments, the user of the computer 102 can choose the electronic devices to be installed on the adapter and change that selection at any time.

In at least some embodiments, each electronic device received on to adapter 150 comprises a non-volatile memory device such as a Secure Digital (SD) card, a Smart Media card, etc. The adapter 150 also comprises a printed circuit board (PCB) 170 which comprises bridge logic 172. Bridge logic 172 converts the slot's electrical interface type to the electrical interface type associated with each electronic device installed on the adapter 150. In some embodiments, the slot's electrical interface type is in accordance with the PCMCIA standard and the electronic device is an SD card. In such case, the bridge logic 170 converts between PCMCIA and SD.

In some embodiments, all of the electronic devices installed on the adapter 150 have the same electrical interface type (e.g., all are SD cards). In other embodiments, at least one of the electronic devices has an electrical interface types that is different from at least one other electronic device. In still other embodiments, all of the electronic devices installed on the adapter 150 have electrical interface types that are different. Further still, while at least one electronic device has an electrical interface type that differs from the slot's electrical interface type, at least one other electronic device has an electrical interface type that is the same as the slot's electrical interface type.

The ability of the adapter 150 to accommodate multiple electronic devices that may or may not have the same electrical interface type as the slot into which the adapter is received provides the user with considerable flexibility. For example, the user can install multiple (e.g., four) SD cards on the adapter 150, install the adapter in a non-SD slot 120 (e.g., a PCMCIA slot), and then selectively access each SD card for storing and/or reading information.

Referring still to FIG. 3, each receiving cavity 160, 162, 164, and 166 of the adapter 150 comprises an electrical connector suitable for mating to a corresponding connector on the electronic device installed in that cavity. Thus, receiving cavity 160 comprises an electrical connector 161, while receiving cavities 162, 164, and 166 comprise electrical connectors 163, 165, and 167, respectively. Each electrical connector 161, 163, 165, and 167 is electrically coupled to the bridge logic 172 on the PCB and, through the bridge logic 172 to edge connector 175 on the adapter 150 via conductor 154. The edge connector 175 mates with a corresponding connector provided internal to the computer's slot 120. As noted above, connector 175 may blind-mate to the slot connector. As such, connector 175 is generally compatible with the electrical interface of the slot 120, while connectors 161, 163, 165, and 167 may not be compatible with the slot's electrical interface.

Figure 4:
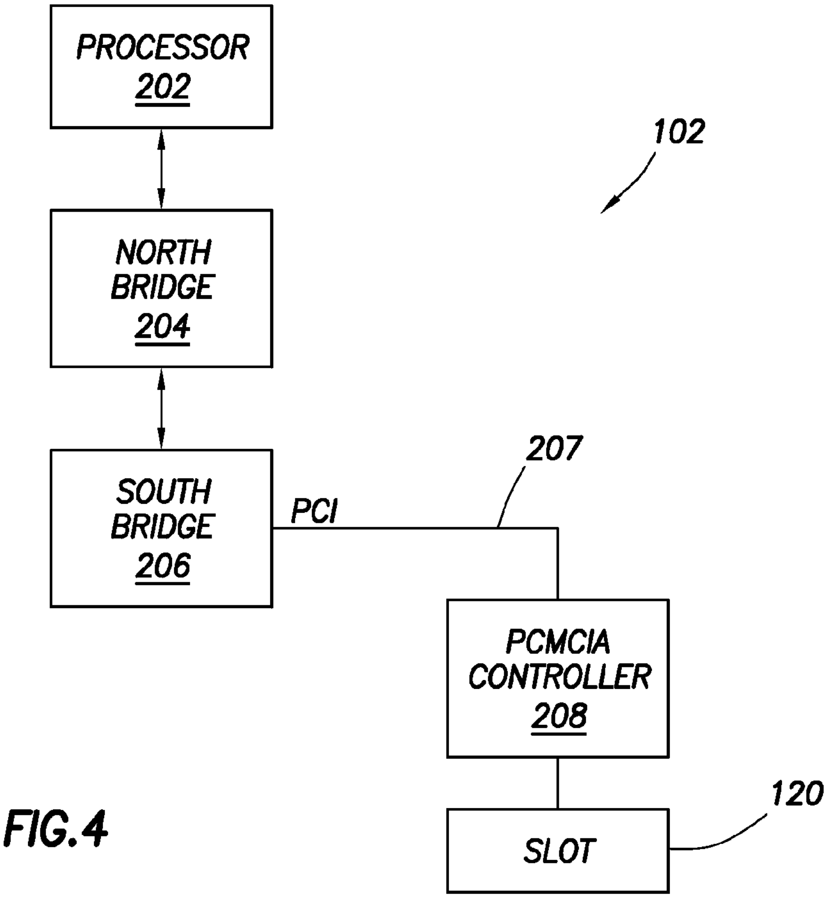
FIG. 4 illustrates a block diagram of the system of FIG. 1 in accordance with various embodiments.

FIG. 4 illustrates a block diagram of computer 102 into which the peripheral device 130 and/or adapter 150 can be received. As shown, computer 102 comprises a processor 202 coupled to a north bridge 204. The north bridge 204 couples to a south bridge 205 and, via a peripheral component interconnect (PCI) bus 207 to, for example, a PCMCIA controller (also referred to as cardbus controller) 208. The slot 120 is electrically coupled to the PCMCIA controller 208. The architecture of FIG. 4 can be varied depending on the type of electrical interface associated with slot 120.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:

a chassis; and a slot externally accessible on said chassis;

said slot being configured to receive a first electronic device having a first electrical interface type, and being configured to receive an adapter that comprises a plurality of receiving portions, each receiving portion adapted to receive a separate electronic device;

wherein at least two receiving portions receives an electronic device that has an identical electrical interface type that differs from the first electrical interface type.

2. The system of claim 1 wherein the adapter comprises a tray.

3. The system of claim 1 wherein the adapter comprises bridge logic to convert the electrical interface type of the electronic device received into the at least two receiving portions to the first electrical interface type.

4. The system of claim 1 wherein each of all of the receiving portions receives an electronic device that has an identical electrical interface type that is different from the first electrical interface type.

5. The system of claim 1 wherein at least two receiving portions receive electronic devices that have electrical interface types that differ from each other.

6. The system of claim 1 wherein the first electrical interface type is selected from a group consisting of PCMCIA, PCI, PCI Express, and USB and said electrical interface type of the electronic device that is received into the at least one receiving portion is selected from a group consisting of SD and Smart Media.

7. The system of claim 4 wherein the adapter comprises bridge logic that converts the electrical interface type of the electronic devices received into the receiving portions to the first electrical interface type.

8. An apparatus, comprising:

an adapter adapted to be received into a slot of a computer, said adapter being configured to receive a plurality of electronic devices that are configured to couple to a first electrical interface type of the computer;

wherein at least two electronic devices comprises an identical electrical interface type that is different from said first electrical interface type.

9. The apparatus of claim 8 further comprising bridge logic on said adapter to convert said first electrical interface type to the electrical interlace type of said at least two electronic devices.

10. The apparatus of claim 8 wherein at least two of said plurality of electrical devices receivable on said adapter comprise electrical interface types that differ from each other.

11. The apparatus of claim 8 wherein all of said plurality of electrical devices receivable on said adapter comprise an identical electrical interface types.

12. The apparatus of claim 8 wherein the first electrical interface type is selected from a group consisting of PCMCIA, PCI, PCI Express, and USB and the electrical interface type of said at least one electronic device is selected from a group consisting of SD and Smart Media.

13. An apparatus, comprising:

means for slidably engaging into a computer slot and for receiving at least two electrical devices that are configured to couple to a first electrical interface type of said slot; and means for converting the first electrical interface type to an electrical interface type compatible with at least two electrical devices;

wherein the electrical interface type of the at least two electrical devices is identical but differs from the first electrical interface type.

14. The system of claim 1 wherein the plurality of receiving portions comprise cavities, each cavity having a separate electrical connection to an electronic device that can be received into said cavity.

15. The system of claim 1 wherein the plurality of receiving portions comprise four cavities.

16. The apparatus of claim 13 wherein the means for slidably engaging receives four electrical devices all having the same electrical interface type but that differs from the first electrical interface type.

* * * * *

UNITED STATES PATENT AND TRADEMARK OFFICE

CERTIFICATE OF CORRECTION

PATENT NO. : 7,505,277 B2
APPLICATION NO. : 11/669434
DATED : March 17, 2009
INVENTOR(S) : Mark S. Tracy et al.

It is certified that error appears in the above-identified patent and that said Letters Patent is hereby corrected as shown below:

In column 4, line 43, in Claim 9, delete "interlace" and insert -- interface --, therefor.

In column 4, line 50, in Claim 11, delete "types" and insert -- type --, therefor.

Signed and Sealed this

Eleventh Day of August, 2009

David J. Kappos

*Director of the United States Patent and Trademark Office*